(12) United States Patent
Walter et al.

(10) Patent No.: US 7,273,569 B2
(45) Date of Patent: Sep. 25, 2007

(54) METAL-CERAMIC HIGH TEMPERATURE SUPERCONDUCTOR COMPOSITE AND PROCESS FOR BONDING A CERAMIC HIGH TEMPERATURE SUPERCONDUCTOR TO A METAL

(75) Inventors: Heribert Walter, Göttingen (DE); Dirk Isfort, Köln (DE)

(73) Assignee: Nexans (FR)

( * ) Notice: Subject to any disclaimer, the term of this patent is extended or adjusted under 35 U.S.C. 154(b) by 371 days.

(21) Appl. No.: 10/679,959

(22) Filed: Oct. 6, 2003

(65) Prior Publication Data
US 2004/0162223 A1 Aug. 19, 2004

(30) Foreign Application Priority Data
Oct. 4, 2002 (EP) .................................. 02292448

(51) Int. Cl.
*H01B 1/00* (2006.01)
*H01B 12/00* (2006.01)
*B32B 15/00* (2006.01)
(52) U.S. Cl. ..................... 252/500; 505/236; 428/615
(58) Field of Classification Search ............... 505/237, 505/238, 236; 174/259, 262, 125.1
See application file for complete search history.

(56) References Cited

U.S. PATENT DOCUMENTS 6,440,904 B1   8/2002   Chen et al. ................. 505/236

FOREIGN PATENT DOCUMENTS

| DE | 4004908 | 8/1991 |
| DE | 19832273 | 11/1999 |
| JP | S64-004029 | * 1/1989 |

OTHER PUBLICATIONS

"Thermal contract between high-T Superconductor and Copper" by Fujishiro et al. Faculty of Engineering, Iwate University, 4-3-5 Morioka 020-8551, Japan, Jan. 17, 2001.
European Search Report dated Mar. 11, 2003.

* cited by examiner

*Primary Examiner*—Mark Kopec
*Assistant Examiner*—Jaison Thomas
(74) *Attorney, Agent, or Firm*—Sofer & Haroun, LLP

(57) ABSTRACT

The present invention relates to a metal-ceramic high temperature super-conductor composite having improved mechanical stability and cooling performance as well as to an improved method for bonding a ceramic high temperature superconductor to a metal surface wherein a bonding is provided, avoiding damage during the cooling of the composite below the critical temperature of the superconductor.

8 Claims, 3 Drawing Sheets

Figure 1:
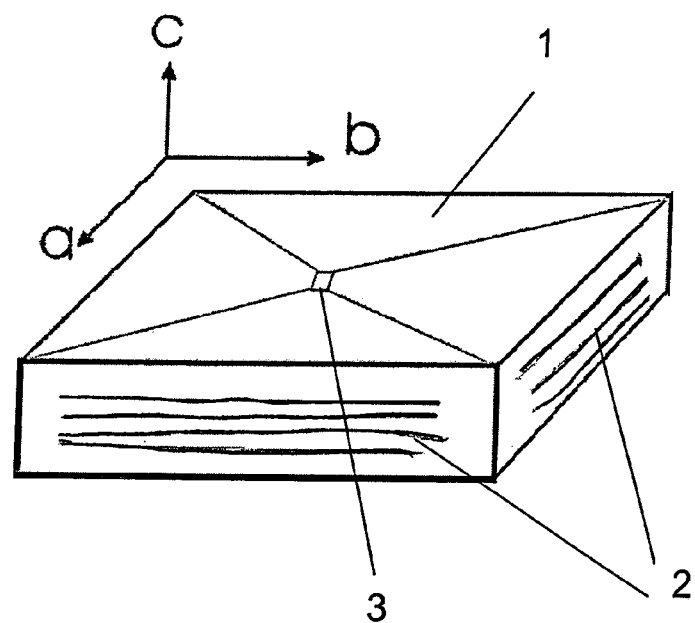

METAL-CERAMIC HIGH TEMPERATURE SUPERCONDUCTOR COMPOSITE AND PROCESS FOR BONDING A CERAMIC HIGH TEMPERATURE SUPERCONDUCTOR TO A METAL

This application is related to and claims the benefit of priority to European Procedure Patent 02 292 448.4, filed on Oct. 4, 2002, the entirety of which is incorporated herein by reference.

The present invention relates to a process for bonding a high temperature superconductor made of a ceramic material to a metal as well as to a metal-ceramic high temperature superconductor composite.

In general superconductors are made of ceramic materials. For application the ceramic ht superconductor must be cooled below the critical temperature at which the ceramic material becomes superconducting. For most superconducting ceramic materials this critical temperature is extremely low.

It is known to cool the superconductor by bringing the superconductor in direct contact with low temperature cooling media such as liquid nitrogen, liquid helium or liquid hydrogen (LN2, LHe, LH2).

According to another method the superconductor is linked to a cooling machine. In this case the superconductor must be connected to an efficient heat conductor in order to carry heat away from the superconductor.

Usually the heat conductor is made of metal and in the form of a plate or tube on which the superconductor is mounted and which is linked to the cooling machine. Suitable metals are Cu, Al, Nl, stainless steel, etc.

For ensuring good heat transfer between the ceramic superconductor and the surface of e. g. the metal plate the superconductor must be in intimate contact with the surface of the metal plate. Generally, for ensuring the intimate contact between the superconductor and the metal plate necessary for good heat transfer the plate is tightly bonded to the ceramic superconductor by a bonding agent such as a heat conducting paste or heat conducting adhesive or by soldering using a solder of good heat conductivity e. g. made of Indium, Bismuth-Indium alloy, Silver alloy or any other solder material with a melting point below 700° C. Thereby a metal-htsc ceramic composite is formed.

However due to the very differing thermal expansion coefficients a ceramic material such as the material from which the superconductor is formed and a metal from which the heat conductor is formed shear stress is produced on the surface of the superconductor resulting in damage of the contact surface and even of the superconductor body.

A further problem is that in htsc ceramics the heat expansion within the ceramic body is extremely anisotropic due to the crystallic nature of the superconducting ceramic.

For example in the well known superconducting material of YBCO-type the heat expansion is by a factor ten higher in the crystallographic ab direction of the crystals than in direction of the crystallographic c axis. In particular in a superconducting YBCO ceramic the difference of the heat expansion coefficient is still more drastically in ab direction with respect to metals such as Cu, Cu having a significantly higher expansion coefficient:

|  | heat conductivity $\lambda[W/m \cdot K]$ | heat expansion coefficient at room temperature $\alpha\ 10^{-5}[1/K]$ |
|---|---|---|
| copper | 384 | 1.68 |
| aluminium | 204 | 2.38 |
| YBCO ortho | 2(c)/10(ab) | 0.3(70 K)-1.0(300 K) |

For ceramic YBCO superconductors when bonded, for example, to a plate of copper, destruction in direction of the ab planes was observed at temperature between 160 and 180 K. In YBCO ceramics the planes in ab direction are the planes of preferred cleavage.

There are two problems which leads to damage of the ceramic superconductor at low temperature such as of LN2.

On cooling shear stress is generated within the ab planes—aligned parallel to the copper plate—at the interface between the ceramic superconductor and the metal plate due to the different thermal expansion coefficient. Further, in the YBCO superconductor a temperature gradient of about 20 K occurs in direction of the c axis at a cooling temperature of 77 K.

Both effects result in destruction, formation of cracks and separation of the superconductor in direction of the ab planes.

Moreover by the anisotropy inherent to superconductor material due to their crystal nature the cooling performance of such superconductors is non uniform. This non uniform cooling performance requires higher cooling power of the cooling machine in order to bring the surface of the ceramic superconductor to the desired low temperature.

This is particularly problematical in superconductor materials of significant anisotropy such as YBCO.

For solving these problems it was suggested setting the superconductor into a metal container in order to form the necessary intimate contact for heat transfer at the lateral faces of the superconductor, that is at the ab planes, which have a better heat conductivity than the in direction of the c axis.

However this solution is restricted to specific applications and cannot be applied in any case.

It was the object of the present invention to provide a metal—ceramic high temperature (ht) superconductor composite being mechanically stabilized which can be cooled to the low temperature necessary for the superconductor to become superconducting without damage on cooling and having improved cooling performance.

This object is solved by a metal—ceramic ht superconductor composite comprising a ceramic ht superconductor bonded to a metal support by a heat conductive bonding agent wherein in the ceramic ht superconductor at least one through hole is provided being in communication to the bonding agent at the interface between the metal support and the ceramic ht superconductor, wherein further bonding agent is provided in the at least one through hole and wherein the bonding agent at the interface and the bonding agent in the at least one through hole are in contact with each other.

According to a further aspect a method is provided for bonding a ceramic ht superconductor to a metal support wherein the ceramic ht superconductor is bonded to a metal support by a heat conductive bonding agent, filling heat conductive bonding agent into at least one through hole provided in the ceramic ht superconductor, said bonding agent at the interface between the metal support and the ceramic ht superconductor and the bonding agent within the at least one through hole forming a connection.

According to the present invention for the heat conductive bonding agent any bonding agent can be used as is typically used for connecting a ceramic ht superconductor to a metal support for carrying heat away to a cooling machine.

Suitable examples are set out above such as heat conductive pastes, heat conductive adhesives and heat conductive solder, such as In, Bi/In and silver alloys or any other solder material with a melting point below 700° C. Further examples for suitable solder material are binary compositions such as SnPb, SnZn, InZn, InAg, BiSn, AuSn, SnCd, SnAg, InSn, SnSb, SnCu, as well as ternary or quaternary compositions or alloys of the above cited components.

If heat conductive adhesives are used, if necessary, the thermal expansion coefficient of the adhesive can be adapted to the respective thermal expansion coefficient of the metal support and/or superconductor by adding a suitable filling material to the adhesive.

Example for suitable filling materials are aluminiumnitride and silicon dioxide or any other material suitable for this purpose.

It is an essential feature of the present invention that within the superconductor at least one through hole is provided for receiving further bonding agent.

As is clear the number and size of the through holes depend on the size of the superconductor body. Possible superconductor body can have sizes in the in range from several mm up to more than 100 mm. Depending on the respective size of the superconductor body through holes can be prepared with diameters of smaller than 1 mm up to more than 10 mm.

Though the size of the diameter of the through holes is not particularly restricted, it is clear that the diameter of the through holes must be at least large enough that sufficient filling of the through holes with the bonding agent is ensured. If the diameter is to small due the surface tension sufficient filling is not longer possible.

By applying the bonding agent not only at the interface between the ceramic ht superconductor and the metal support but also within at least one through hole provided within the superconductor in a manner that the bonding agent at the interface and the bonding agent within the at least one through hole are in contact with each other a flexible binding is generated between the ceramic superconductor and the metal support.

Due to this flexible binding differences in length between the superconductor and the metal support coming into being on cooling due to different thermal expansion coefficients are compensated.

To the contrary in the hitherto known composites as discussed above wherein the bonding agent is present only at the interface between the superconductor and the metal support the binding is rigid thus allowing no sufficient compensation.

Furthermore since the bonding agent has a thermal expansion coefficient higher than that of the ceramic ht superconductor by the bonding agent present in the at least one through hole mechanical tension is exerted which acts along the through hole. If preferred planes for cleavage are oriented vertical to the through hole the tension can prevent cleavage. Due to this higher thermal expansion coefficient of the bonding agent present in the at least one through hole and which in addition is in contact with the bonding agent on the surface of the metal support mechanical strengthening of the superconductor in direction to the tension is achieved.

By the bonding agent present in at least one through hole heat can be carried away uniformly over the whole volume of the superconductors since the bonding agent within the through holes is in intimate contact to the superconductor. Thus, by the present invention, generation of a disadvantages temperature gradient within the superconductor can be avoided on cooling.

For the present invention the term "superconductor" and "ceramic (ht) superconductor", respectively, means a shaped body made of a superconducting material or a precursor material for a superconducting material which becomes superconducting on further suitable treatment such as thermal treatment as is generally known in the field of ceramic superconductors.

In principle, the present invention is applicable to any type of superconductor or superconductor application associated with the same or similar problems as set out above arising from the difference of thermal heat expansion coefficient of a superconductor and a material to which the superconductor is bonded.

Particularly the present invention can be used to bind a ceramic superconductor to any metal body.

Suitable materials of the ceramic superconductor include, for example, ceramic superconductors of the oxide, sulfide, selenide, telluride, nitride, boron carbide and oxycarbonate types. Oxide type ceramic superconductors are preferred, for example, members of the rare earth family (REBCO), the bismuth family (BSCCO), the thallium family (TBCCO) or the mercury family (HBCCO).

Suitable elements for RE can be selected from the group consisting of Y, Pr, Nd, Sm, Eu, Gd, Tb, Dy, Ho, Er, Tm and Yb.

In particular preferred examples of ceramic superconductors to which the present invention is applicable are ceramic superconductor materials generally referred to BSCCO 2212 and 2223 as well as YBCO 123. Furthermore, superconductor materials derived therefrom by total or partial substitution of one or more metal components and/or addition of further suitable components and/or compounds for adjusting the properties of the resulting superconductor. Such substituents and/or additives are well known to those skilled in the art The above aspects of the present invention as well as further aspects are now illustrated in more detail by reference to a YBCO 123 superconductor material being a preferred embodiment of the present invention, and by reference to the accompanying figures.

It is shown in

Figure 2:
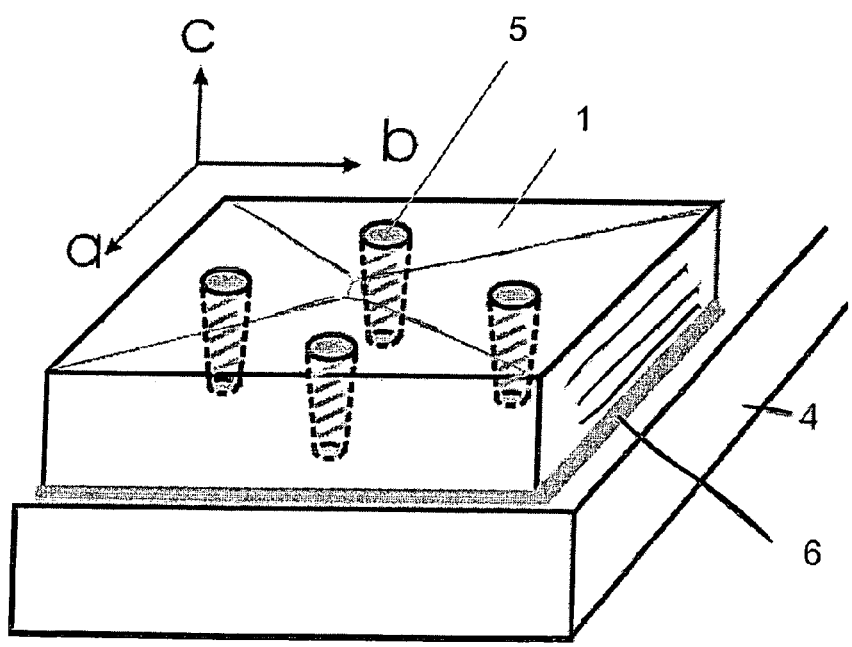
Figure 3:
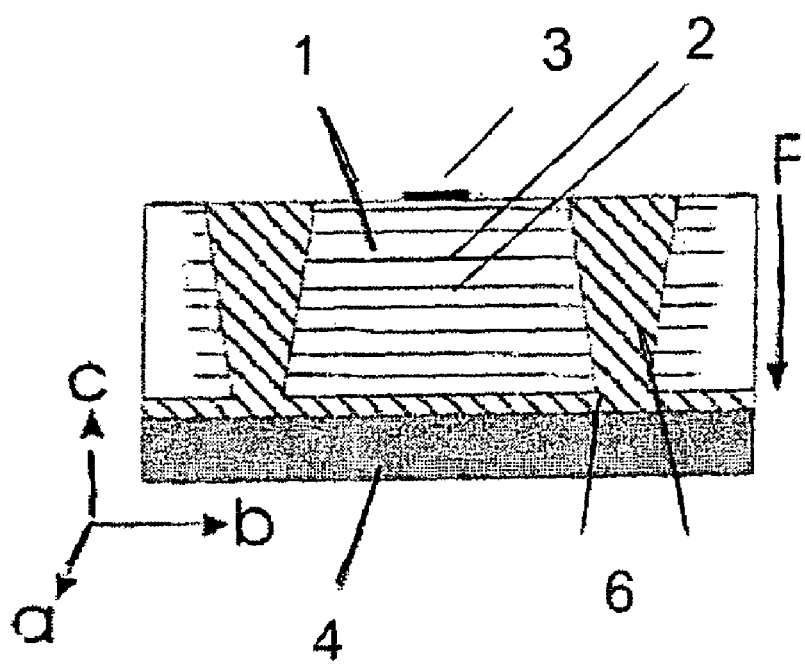
Figure 4:
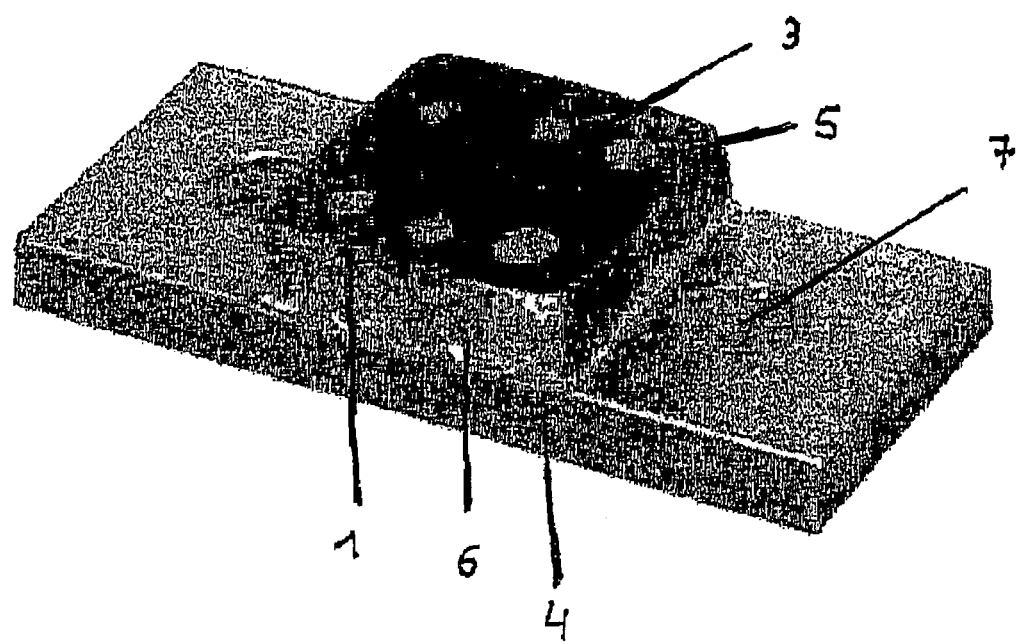

FIG. 1 an example of a superconductor suitable for the present invention;

FIG. 2 a schematic view of the metal-ceramic ht superconductor composite according to the present invention;

FIG. 3 a section through the composite of the present invention shown in FIG. 2; and FIG. 4 a photo of an embodiment of a metal-ceramic high temperature superconductor composite according to the present invention.

YBCO superconductors ($Y_1Ba_2Cu_3O_7$) have a critical temperature of 93 K. They are typically produced by the Top Seeding Melt Growth (TSMG) method which is generally well known.

In general in the TSMG method a powder having the stoichiometric composition of Y123 is mixed with suitable additives, a suitable starting mixture being for example Y123+25 mol % $Y_2O_3$+1 wt % $CeO_2$.

This starting powder is formed to the desired shaped body such as a plate, cylindrical body etc., for example by pressing.

Subsequent to pressing the obtained pressed body is subjected to a sintering process. In the course of the sintering process the density of the pressed body increases drastically.

From the sintering process a sintered body of a composition of Y123 is obtained which however is not superconducting.

A texturing process has to be carried out for oriented crystal growth which is essential for the superconducting properties of the final superconductor.

Generally oriented crystal growth is carried out by thermal treatment wherein the sintered body is partially melted and the partial melt cooled by an appropriate cooling process.

In the TSMG for inducing and improving the crystal growth in the preferred orientation on top of the sintered body single crystal of $R_1Ba_2Cu_3$ with R=rare earth, is placed as a seed, said seed having a crystal lattice identical to the lattice of the final Y123 superconductor which is of perovskite, and having a melting point which is higher than that of Y123 of 1000° C.

For example a suitable seed material for Y123 is $Sm_1Ba_2Cu_3O_7$ having a melting point of 1060° C.

The sintered body with the seed material on top is heated to a temperature at which the sintered body melts partially but the seed material remains solid, that is is not melted. By the crystalline SmBCO seed which is solid at the melting point of the YBCO material of the sintered body the information of the crystal structure of the seed is transferred to the partial melt of the sintered body. By the appropriate cooling process growth of the desired crystal lattice proceeds from the seed.

For converting the obtained textured body into the desired superconductor heat treatment for adjusting the oxygen content has to be carried out in a well-known manner.

A Y123 superconductor in form of a plate is schematically shown in FIG. 1. In FIG. 1 1 denotes the textured YBCO superconductor with the cleavage planes parallel to the crystallographic ab axis' 2 Further, direction of axis' a, b and c are shown.

By the above TSMG method monolithic Y123 superconductors of single domane can be obtained having an edge length of about 60 mm. Such superconductors can be used for example for the construct n of magnetic bearing systems.

In FIG. 2 an embodiment of the metal-ceramic ht superconductor composite of the present invention is shown schematically.

The ceramic superconductor 1 is bonded by a bonding agent 6 to a metal support 4 in form of a plate.

The present invention is applicable for bonding a ceramic superconductor to any type of metal support. The metal of which the support is made can be a metal of the iron group (Iron, Cobalt and Nickel) or any non iron group metal. Preferred are Cu, Al, Ni and stainless steel.

Further, also the shape of the support is not particularly restricted. The support can have the form of a plate, cylinder, tube etc.

Preferably the superconductor 1 is bonded to the support 4 by soldering using the solders set out above.

Preferably an indium solder or indium containing solder is used.

In order to ensure intimate contact between the superconductor 1 and the metal support 4 preferably the bonding agent 6 forms an intermediate layer covering the whole contact surface between the ceramic superconductor 1 and the metal support 4 as indicated In FIG. 2.

However if appropriate, it is also possible that the bonding agent 6 covers the contact surface only partially provided that the purpose of the present invention is met. In this case care has been taken that the bonding agent at the interface and the bonding agent filled into the through holes 5 are in contact with each other.

The superconductor is provided with through holes 5, here four through holes are shown. The through holes 5 are vertically aligned with respect to the support 4 and with respect to the ab planes 2 of the Y123 superconductor. The through holes 5 are in communication with the bonding agent 6 at the interface between the superconductor 1 and the support 4.

The through hole 5 can have also an inclined orientation with respect to the support Further, in FIG. 2 the through hole 5 are conically with the diameter decreasing towards the support. However it is also possible to make the through holes in a straight manner the conical form being preferred. In case of conical form an particularly intensive contact between the bonding agent and the inner surface of the through holes can be achieved.

Into the through holes further bonding agent is filled. It is not necessary to fill the through holes completely with the bonding agent. However complete or approximately complete filling is preferred in order to ensure the generation of sufficiently high tension in direction along the through hole 5.

For example in a Y123 superconductor in order to avoid damage of the ab planes tension generated by the bonding agent within the through holes 5 acts in direction parallel to the c axis as shown In FIG. 2.

For the generation of a sufficiently high tension it is preferred that the bonding agent exhibits a higher thermal expansion coefficient than the superconductor material.

On cooling due to the higher thermal expansion coefficient a higher contraction of the bonding agent is achieved compared to the contraction of the superconductor material. The tensile force resulting from the contraction of the bonding agent acts directly on the wall of the preferably conically shaped through hole and results in an intensive contact between bonding agent and the htsc material over the whole temperature cycle during the cooling process.

FIG. 3 is a cross section along the line of tho through holes 5 of FIG. 2 showing the continuous connection formed by the bonding agent 6 within the through holes 5 and the bonding agent 6 covering the interface between the ceramic superconductor 1 and the support 4.

In FIG. 3 by the arrow on the right side directed towards the support 4 the direction of the tension executed by the bonding agent within the through holes 5 is indicated.

As set out above for avoiding damage of a superconductor in direction of planes for a given superconductor material a bonding agent should be applied having a thermal expansion coefficient being sufficiently higher than the thermal expansion coefficient of the superconductor material in order to ensure the generation of a sufficiently high tension perpendicular to said planes, e.g. in case of Y123 in direction of the c axis. For example for Y123 superconductor in solder is a particularly suited bonding agent to this respect.

The at least one through hole 5 within the superconductor 1 can be produced by any suitable method, such as drilling etc.

The through holes 5 can be provided in the superconductor 1 after pressing, after sintering or after texturing of the sintered body. Preferably, the through holes 5 are provided before the texturing. In this case the growing crystals will grow around the through holes 5.

If a solder bonding is applied according to a preferred embodiment of the present invention the surface of the superconductor adjacent to the support, that is the surface by which the superconductor is bound to the support, and/or the inner surface of the wall of the through holes 5 can be completely or at least partially metalized by providing a thin metal layer thereon.

The metalized layer can be provided by electrolyting surface coating or can be a burnt in metal layer such as a burnt in Sliver layer. Materials and techniques for providing such burnt in metal layer into superconductors are generally known. For example the metal can be provided on the respective surfaces by means of spraying, immersing, brushing etc.

By metalizing the surface of the superconductor bonded to the support and/or the inner surface of the wall of the through holes 5 at least partially or preferable completely the mechanical stability of the bonding at low temperatures and in particular on cooling when large temperature steps occurs can be further improved.

According to a further embodiment holes or cavities are provided in the surface of the metal support 2 facing the superconductor 1.

In the final composite also these additional holes are filled with bonding agent resulting in an improvement of the stability of the composite as well as supporting the dissipation of heat The location on the surface of the metal support, number, size and shape of these additional holes is not particularly restricted but can be chosen according to need.

The holes can be located at any position on the support member. Preferably they are positioned opposite to an through hole 5.

Preferably the holes are blind holes.

Preferably the holes are of conical shape, in particular wherein the diameter increases towards the bottom of the holes. That is, the shape of the conical hole is the other way round as is the case of the preferred conical shape of the through holes.

According to yet another embodiment pins can be provided on the surface of the metal support projecting into the through holes 5 of the ceramic superconductor 1.

Preferably, the pins are made of a material having a good heat conductivity such as a metal or another material of good heat conductivity.

For example, the pins can be made from the same material than the metal support.

By the provision of such pins the stability of the composite as well as dissipation of heat is improved.

The number of that pins can be chosen according to need. For example them can be provided a pin for each through hole or the number of pins can be less than the number of the through holes 5.

The diameter of the pins should be less than the diameter of the through holes so that in the inserted state a gap remains between the inner surface of the through holes and the surface of the pins large enough to ensure sufficient wetting by the solder.

Furthermore also a combination of pins and additional holes in the surface of the metal support 2 opposite to the surface of the ceramic superconductor is possible.

As set out above, by the provision of the additional holes and/or pins heat dissipation can be improved. Good heat dissipation is particularly required in applications such as fly wheels, electric motors and bearing housing for which the present invention can be advantageously used.

EXAMPLE

A stoichiometric Y123 powder was mixed with 25 mol % $Y_2O_3$ and 1 wt % $CeO_2$. The powder was pressed into the form of a plate and sintered.

In the obtained sintered body conical through holes were provided by drilling with the diameter of the through holes being a little bit larger at the top surface of the plate than on the bottom surface.

A seed material of $Sm_1Ba_2Cu_3O_7$ was placed on the top surface of the sintered body and texturing was carried out by heating the sintered body to a temperature above the melting point of the Y123, i.e. 1000° C., but below the melting point of the seed material, i.e. 1060° C., thereby melting the sintered body partially.

On cooling the growing crystals grew around the through holes.

The resulting superconductor body was mechanically finished by adjusting the dimensions in accordance to the desired technical application. Further, the bottom surface of the superconductor body was smoothed for facilitating bonding to a support.

On the bottom surface of the superconductor body Silver was provided for generating a burnt in metal layer.

The thus obtained shaped body was subjected to a heat treatment at 850° C. at which the metal provided on the bottom surface of the shaped body was burnt into the shaped body thus forming a burnt in metal layer.

Subsequently the temperature was decreased to 480° C. and held at 480° C. for 120 hours for adjusting the phase of the superconductor by oxygen absorption thereby inducing conversion of the phase from tetragonal to orthorhombic, that is from the non superconducting tetragonal phase to superconducting orthorhombic phase.

An oxide layer formed on the surface of the silver layer during the above heat treatment was removed by a weak acid such as citric acid to ensure suitable bonding properties.

The resulting superconductor body is soldered to the surface of a metal support by using indium solder, the surface of the metal support having been cleaned prior to soldering.

The through holes within the superconductor body were completely filled with indium solder until an intimate contact was obtained with the solder at the interface between the bottom surface of the superconductor and the surface of the metal support.

The resulting metal-ceramic superconductor composite could be cooled below critical temperature without any damage. No temperature gradient was observed.

A photo of the metal-ceramic htsc composite obtainable by the process referred to above is shown in FIG. 4.

In this embodiment a YBCO 123 superconductor (1) is placed on a copper support (4) being bonded to each other by a soldering bonding using BiIn (6). In the superconductor (1) 6 through holes (5) are provided filled with BiIn solder (6). Further on the surface of the superconductor the seed crystal (3) is still discernible In the copper support (4) two bores (7) are provided for fixing means.

The dimensions of the composite are as follows:

| | |
|---|---|
| superconductor body (1) | 37 mm breadth, 37 mm length and 12 mm height; |
| support (4) | 40 mm breadth, 100 mm length and 10 mm height. |

LIST OF REFERENCE NUMERALS

1 superconductor
2 cleavage plane ab
3 seed
4 metal support
5 through hole
6 bonding agent
7 bore

The invention claimed is:

1. Metal-ceramic high temperature superconductor composite comprising a ceramic ht superconductor bonded to a metal support by a heat conductive bonding agent, wherein said heat conductive bonding agent is a layer disposed between said metal support and said ceramic ht superconductor, and wherein in the ceramic ht superconductor has at least one through hole being in communication to the heat conductive bonding agent at an interface between the metal support and the ceramic ht superconductor, wherein further heat conductive bonding agent is provided in the at least one through hole and wherein the heat conductive bonding agent at the interface and the heat conductive bonding agent in the at least one through hole are in contact with each other.

2. Metal-ceramic ht superconductor composite according to claim 1, wherein the at least one through hole has a conical shape with the diameter decreasing toward the metal support.

3. Metal-ceramic ht superconductor composite according to claim 1, wherein the bonding between the superconductor and the metal support is selected from a group consisting of a solder bonding and a bonding by an adhesive system.

4. Metal-ceramic ht superconductor composite according to claim 1 wherein the superconductor is a $REBa_2Cu_3O$ type superconductor with RE being Rare Earth Metal selected from Y, Pr, Nd, Sm, Eu, Tb, Dy, Ho, Er, Tm and Yb.

5. Metal-ceramic ht superconductor composite according to claim 1 wherein the bonding between superconductor and the metal support is a soldier bonding and wherein the bottom surface of the superconductor adjacent to the metal support and/or the inner surface of the wall of the trough holes are at least partially metalized with an additional metal layer.

6. Metal-ceramic ht superconductor composite according to claim 1, wherein the superconductor is of $REVa_2Cu_3O$ having an additional burnt in sliver layer at its bottom surface and/or a burnt in silver layer at the inner surface of the wall of the through holes.

7. Metal ceramic ht superconductor composite according to claim 1, wherein at least one hole is provided in the surface of the metal support facing the superconductor.

8. Metal ceramic ht superconductor composite according to claim 1, wherein at least one pin is provided on the surface of the metal support projecting into a through hole.

* * * * *